United States Patent
Venugopal et al.

(10) Patent No.: US 10,838,483 B2
(45) Date of Patent: Nov. 17, 2020

(54) LEVEL SHIFTER WITH ISOLATION ON BOTH INPUT AND OUTPUT DOMAINS WITH ENABLE FROM BOTH DOMAINS

(71) Applicant: Apple Inc., Cupertino, CA (US)

(72) Inventors: Vivekanandan Venugopal, San Jose, CA (US); Michael R. Seningen, Austin, TX (US); Ajay Kumar Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 79 days.

(21) Appl. No.: 16/144,342

(22) Filed: Sep. 27, 2018

(65) Prior Publication Data
US 2020/0103957 A1    Apr. 2, 2020

(51) Int. Cl.
*G06F 1/3296* (2019.01)
*H03K 19/0185* (2006.01)

(52) U.S. Cl.
CPC ... *G06F 1/3296* (2013.01); *H03K 19/018585* (2013.01)

(58) Field of Classification Search
CPC .................................................. H03K 19/0175
See application file for complete search history.

(56) References Cited

U.S. PATENT DOCUMENTS

| | | | |
|---|---|---|---|
| 7,834,662 B2 | 11/2010 | Campbell et al. | |
| 8,339,177 B2 * | 12/2012 | Jarrar | H03K 19/018521 326/62 |
| 8,559,247 B2 | 10/2013 | Shiu | |
| 8,791,743 B1 | 7/2014 | Tang et al. | |
| 9,385,723 B1 | 7/2016 | Zhao et al. | |
| 9,564,901 B1 | 2/2017 | Chow et al. | |
| 9,893,726 B1 | 2/2018 | Katakwar | |
| 10,187,061 B1 * | 1/2019 | Venugopal | H03K 19/0013 |

* cited by examiner

*Primary Examiner* — Hai L Nguyen
(74) *Attorney, Agent, or Firm* — Kowert Hood Munyon Rankin and Goetzel PC; Rory D. Rankin

(57) ABSTRACT

A system and method for efficiently handling voltage level shifting are contemplated. In various embodiments, a first level shifter receives a first isolate enable signal based on a first power supply voltage and a second isolate enable signal based on a second power supply voltage different from the first power supply voltage. A second level shifter generates the first isolate enable signal based on both the second isolate enable signal and the first power supply voltage. A circuit block generates a data signal based on the first power supply voltage. When it is determined that isolation for the first level shifter is enabled, the first level shifter generates a voltage level on an internal particular node to a particular voltage level based on the first isolate enable signal, and also prevents, using the second isolate enable signal, the data signal from setting a voltage level on the particular node.

20 Claims, 5 Drawing Sheets

LEVEL SHIFTER WITH ISOLATION ON BOTH INPUT AND OUTPUT DOMAINS WITH ENABLE FROM BOTH DOMAINS

BACKGROUND

Technical Field

Embodiments described herein are related to the field of integrated circuit implementation, and more particularly to level shifting circuits.

Description of the Related Art

Various integrated circuits (ICs) include more than one power supply. Each power supply conveys a power signal at a different voltage from the other power supplies. In some ICs, one or more voltage regulators are used to generate power signals of varying voltage levels from a single power supply. The various power signals are used by different circuits in an IC, each power signal supplying power in a respective power domain. In an IC, a processing core is in a first power domain and another circuit, such as, for example, a memory array, is in a second power domain. Voltage levels associated with the binary logic high levels of data and control signals used between the processing core and the memory array need to be shifted from the voltage level of the first power domain to the voltage level of the second power domain, and vice versa.

A level shifting circuit is used to shift a data or control signal between power domains. A level shifting circuit, also referred to as a level shifter, receives a data or control signal generated in the first power domain, and generates an output signal, with a same binary logic level, in the second power domain.

SUMMARY OF THE EMBODIMENTS

Systems and methods for efficiently handling voltage level shifting are contemplated. In various embodiments, a computing system includes a first circuit block, a second circuit block, a first level shifter and a second level shifter. A second isolate enable signal is based on the second power supply voltage and it is asserted when conditions are satisfied for isolating the first level shifter. The second level shifter generates a first isolate enable signal based on both the second isolate enable signal and the first power supply voltage. Therefore, the first and the second isolate enable signals are based on different power supply voltages. In various embodiments, the first isolate enable signal is a delayed version of the second isolate enable signal. The first circuit block is connected to the first power supply voltage, and it generates a first data signal using the first power supply voltage.

When it is determined that isolation for the first level shifter is disabled, the first level shifter generates a second data signal based on both the second power supply voltage and the first data signal. The second circuit block is connected to the second power supply voltage, and it receives the second data signal. In various embodiments, the first level shifter is connected to the first power supply voltage and the second power supply voltage, and it receives both the first isolate enable signal and the second isolate enable signal.

When it is determined that isolation for the first level shifter is enabled, the first level shifter generates a voltage level on a particular node included in the first level shifter to a particular first voltage level based on one or more of the first isolate enable signal, the second isolate enable signal, and complement values of these signals. In an embodiment, each of the first isolate enable signal and the second isolate enable signal is asserted when isolation for the first level shifter is enabled. A latch circuit of the first level shifter conveys output signals of the first level shifter. The latch circuit receives a voltage level set on the particular node. Since the latch circuit receives the first voltage level at the particular node during isolation of the first level shifter, at least one of the output signals of the first level shifter is set at a particular second voltage level. In some embodiments, the first voltage level is equal to the second voltage level. In addition to generating the particular voltage level, the first level shifter also prevents, using the second isolate enable signal, the first data signal from setting a voltage level on the particular node. Therefore, there are no glitches, or spurious voltage levels, on the particular node or the outputs of the first level shifter.

BRIEF DESCRIPTION OF THE DRAWINGS

The following detailed description makes reference to the accompanying drawings, which are now briefly described.

Figure 1:
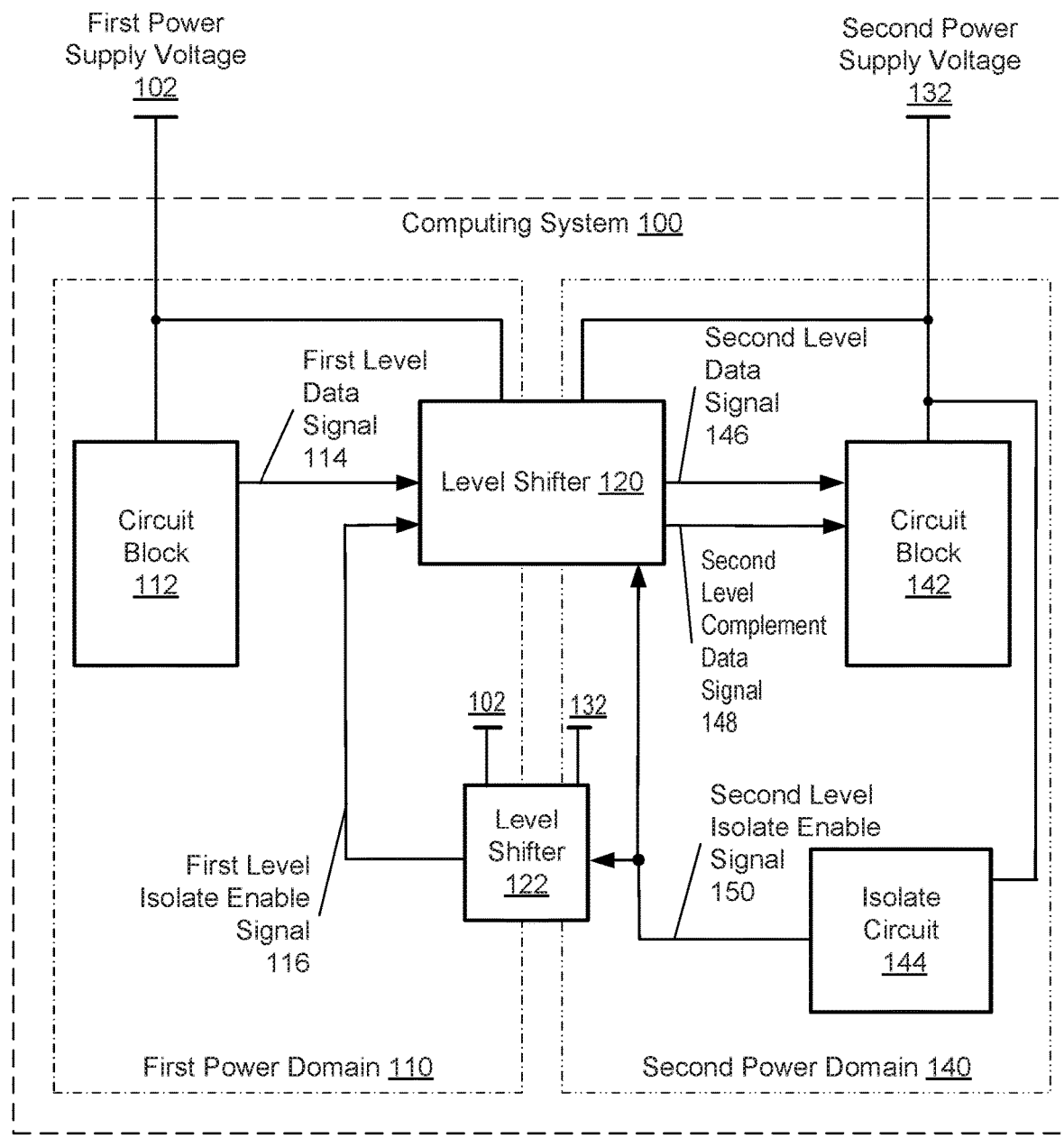
FIG. 1 shows a block diagram of an embodiment of a computing system with two power domains.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

Referring to FIG. 1, a generalized block diagram of one embodiment of a computing system 100 is shown. In the illustrated embodiment, two power domains are shown. A first power domain 110 uses the first power supply voltage 102, and a second power domain 140 uses the second power supply voltage 132. As shown, the first power domain 110 includes at least circuit block 112, and the second power domain 140 includes at least circuit block 142 and isolate circuit 144. The computing system 100 also includes level shifters 120-122 for translating voltage levels of particular data and control signals.

In some embodiments, the first power supply voltage 102 is appreciably different from the second power supply voltage 132. Although the terms "first" and "second" are used, the terms "source" and "target" can also be used to denote a particular direction of a data or control signal. In one example, circuity in power domain 110 that generates a data or control signal is considered the "source," whereas, circuitry in power domain 140 that receives the generated data or control signal is considered the "target." In a similar manner, the terms "source" and "target" are switched between power domains 110 and 140 when the other signal direction is used. Likewise, the terms "input" and "output" can also be used to denote a particular direction of a data or control signal. Since data and control signals are capable of being transferred in both directions, the terms "first" and "second" are used here.

Circuits connected to a common power supply voltage at a particular voltage level are referred to as belonging to the same "power domain" (also referred to herein as a "voltage domain"). In cases where the two power domains employ different power supply voltage levels, such as the first power supply voltage 102 is appreciably different from the second power supply voltage 132, voltage levels of the transmitted data and control signals are adjusted (in a process commonly referred to as "level shifting") so the data and control signals are compatible with the receiving circuit. In the illustrated embodiment, level shifter 120 transmits the first level data signal 114 from circuit block 112 to the circuit block 142 as the second level data signal 146.

To manage power consumption in the computing system 100, a power management unit (not shown), or other circuitry, identifies circuits that are not being used. To reduce power consumption, power supply signals of power domains that include such unused circuits are disconnected from power supply circuits in a process referred to as "power gating." When the power supply signal of a particular power domain, such as the first power domain 110 or the second power domain 140, is disconnected from the power supply circuits, the voltage level of the power supply signal becomes indeterminate. Such indeterminate voltage levels on power supply signals are problematic for any circuits receiving data and control signals from a power gated power domain such as one of the first power domain 110 and the second power domain 140.

When a level shifter circuit receives signals from a power gated power domain, and each of the level shifter and circuitry in the power gated domain does not include extra circuitry to compensate for the indeterminate voltage levels, in some cases the level shifter circuit experiences "crowbar" or "shoot-through" current created when a low impedance circuit path is enabled between a power supply node and a ground node. As used and described herein, a circuit path refers to a collection of circuit elements coupled together between two circuit nodes, such as, between a power supply node and a ground node, for example. As described shortly for the computing system 100, the level shifter 120 includes circuitry to compensate for receiving indeterminate voltage levels on data and control signals such as the first level data signal 114. For example, the level shifter 120 receives the first level isolate enable signal 116 generated from the second level isolate enable signal 150 by the level shifter 122.

In addition to crowbar current resulting from receiving signals from a power gated power domain, such as one of the first power domain 110 and the second power domain 140, particular nodes included in level shifter circuits are capable of transitioning to undesirable voltage levels due to the indeterminate voltage levels on the power supply signals, which results in unwanted signal transitions when the power supply voltage levels return to specified operating levels. In various embodiments, one or more of the level shifters 120-122 utilize operating techniques that reduce crowbar current in an included latch, and maintain a stable output state during power gating transitions or other events that would otherwise result in indeterminate voltage levels on received signals.

As described earlier, in some embodiments, the voltage values in the computing system 100 for the first power supply voltage 102 and the second power supply voltage 132 are appreciably different. In some embodiments, a voltage level of the first power supply voltage 102 is greater than a voltage level of the second power supply voltage 132. Alternatively, in other embodiments, the voltage level of the first power supply voltage 102 is less than the voltage level of the second power supply voltage 132. In various embodiments, the power supply voltages 102 and 132 are generated by a power management unit (not shown). During operation, when the computing system 100 changes operation mode to a low-power operation mode, the voltage level of one or more of the power supply voltages 102 and 132 are disabled. Disabling one or more of the power supply voltages 102 and 132 creates an indeterminate voltage level.

Since the voltage levels of the power supplies 102 and 132 are different, one or more of the voltage levels for high and low binary logic levels used in the first power domain 110 and the second power domain 140 are also different. In order for data and control signals from the first power domain 110 to be used by circuitry in the second power domain 140, the voltage levels are translated such as by level shifter 120. Similarly, for data and control signals from the second power domain 140 to be used by circuitry in the first power domain 110, the voltage levels are translated such as by level shifter 122.

As shown, circuit block 112 sends a first level data signal 114 to circuit block 142. Although signal 114 is described as a data signal, in other embodiments, signal 114 is a control signal or a clock signal. First level data signal 114 uses the first power supply voltage 102 for setting a logic high value. Circuit block 142 receives second level data signals 146 and 148 based on the first level data signal 114. The second level complement data signal 148 is a binary complement of the second level data signal 146. Each of the second level data signals 146 and 148 uses the second power supply voltage 132 for setting a logic high value. Level shifter 120 receives both the first power supply voltage 102 and the second power supply voltage 132 and spans both the first power domain 110 and the second power domain 140.

As used and described herein, a "logic low level," a "logic 0 value," or a "binary logic low level" corresponds to a voltage level sufficiently low to enable a p-type metal oxide semiconductor (MOS) field effect transistor (FET), which is also referred simply as a "PFET." Similarly, a "logic high level," a "logic 1 value," or a "binary logic high level" corresponds to a voltage level sufficiently high to enable an n-type metal oxide semiconductor (MOS) field effect transistor (FET), which is also referred simply as an "NFET." In various other embodiments, different technology, including technologies other than complementary metal-oxide semiconductor (CMOS), result in different voltage levels for "low" and "high."

In various embodiments, level shifter 120 translates the voltage levels of the first level signal 114 to generate the second level signals 146 and 148. Signals 114, 146 and 148 transition between two voltage levels, each voltage level corresponding to a particular binary logic state. Signals that encode information in this fashion are commonly referred to as digital signals. In one example, the first level signal 114 transitions between a ground reference voltage level and a voltage level at or near the voltage level of the first power supply voltage 102. In this case, the ground reference voltage level corresponds to a binary logic low level, and the voltage level at or near the voltage level of the first power supply voltage 102 corresponds to a binary logic high level.

In some embodiments, level shifter 120 translates the voltage level corresponding to a binary logic high level between the first power domain 110 and the second power domain 140. For example, level shifter 120 translates the voltage level at or near the voltage level of the first power supply voltage 102 to a voltage level at or near the voltage level of the second power supply voltage 132. In an embodiment, each of these voltage levels is used to indicate a binary logic high level.

In other embodiments, level shifter 120 translates the ground reference voltage level of the first power supply voltage 102 to the ground reference voltage level of the second power supply voltage 132. In an embodiment, each of these ground reference voltage levels is used to indicate a binary logic low level. For example, the binary logic low level is zero volts in some power domains, whereas the binary logic low level is a negative value, such as −150 millivolts, for other power domains. In yet other embodiments, level shifter 120 translates voltage levels for each of the binary logic high level and the binary logic low level between the first power domain 110 and the second power domain 140.

In the illustrated embodiment, the isolate circuit 144 uses the second power supply voltage 132, and is included in the second power domain 140. In various embodiments, isolate circuit 144 generates the second level isolate enable signal 150 in response to a change in an operational mode of the computing system 100 or other suitable event, which causes level shifter 120 to isolate one or more circuit paths included in level shifter 120 as well as clamp one or more circuit nodes of level shifter 120 to particular values. In various embodiments, level shifter 122 translates one or more of the voltage levels used for the binary logic high level and the binary logic low level for the second level isolate enable signal 150 to voltage levels used in the first power domain 110. The resulting translated signal, which is the first level isolate enable signal 116, is received by the level shifter 120.

When only the second level isolate enable signal 150 is used by level shifter 120, glitches are caused on the outputs of level shifter 120 when level shifter 120 is coming out of isolation. As used herein, "glitches" on a node refer to spurious voltage levels on the node. By using both the second level isolate enable signal 150 from the second power domain 140 and the first level isolate enable signal 116 from the first power domain 110, internal nodes of level shifter 120 are set to particular states so that glitches are not created on the outputs of level shifter 120 when isolation is disabled.

In various embodiments, the computing system 100 is a system on a chip (SoC) that includes multiple types of integrated circuits on a single semiconductor die, each integrated circuit providing a separate functionality. In some embodiments, computing system 100 is also referred to as an application specific integrated circuit (ASIC), or an apparatus. In other embodiments, the circuit blocks 112 and 142 are individual dies within a package such as a multi-chip module (MCM). In yet other embodiments, the circuit blocks 112 and 142 are individual dies or chips on a printed circuit board.

Clock sources, such as phase lock loops (PLLs), interrupt controllers, power management units, and so forth are not shown in FIG. 1 for ease of illustration. It is also noted that the number of components of the computing system 100 vary from embodiment to embodiment. In other embodiments, there are more or fewer of each component than the number shown for the computing system 100. In an embodiment, one or more of the circuit blocks 112 and 142 is a processor complex. The term "processor complex" is used to denote a configuration of one or more processor cores using local storage (not shown), such as a local shared cache memory subsystem, and capable of processing a workload together. For example, in an embodiment, the workload includes one or more programs comprising instructions executed by a processor. Any instruction set architecture is implemented in various embodiments. In various embodiments, the processor is one or more of a central processing unit (CPU), a data parallel processor like a graphics processing units (GPU), a digital signal processors (DSP), a multimedia engine, and so forth.

In some embodiments, one or more of the circuit blocks 112 and 142 is representative of any number of input/output (I/O) interfaces or devices and provide interfaces to any type of peripheral device implementing any hardware functionality included in computing system 100. For example, in an embodiment, any of the circuit blocks 112 and 142 connect to audio peripherals such as microphones, speakers, interfaces to microphones and speakers, audio processors, digital signal processors, mixers, etc. Other I/O devices include interface controllers for various interfaces external to computing system 100, including interfaces such as Universal Serial Bus (USB), peripheral component interconnect (PCI) including PCI Express (PCIe), serial and parallel ports, general-purpose I/O (GPIO), a universal asynchronous receiver/transmitter (uART), a FireWire interface, an Ethernet interface, an analog-to-digital converter (ADC), a digital-to-analog converter (DAC), and so forth. Other I/O devices include networking peripherals such as media access controllers (MACs).

In some embodiments, circuit blocks 112 and 142 transfer messages and data to one another through a fabric, which is not shown for ease of illustration. In various embodiments, the fabric includes a hierarchy of clusters, and each cluster includes control logic for selecting transactions to send from a source to a destination. For example, multiple multiplexers (or muxes) are used. In some embodiments, the communication fabric is packet-based, and is hierarchical with bridges, cross bar, point-to-point, or other interconnects.

Figure 2:
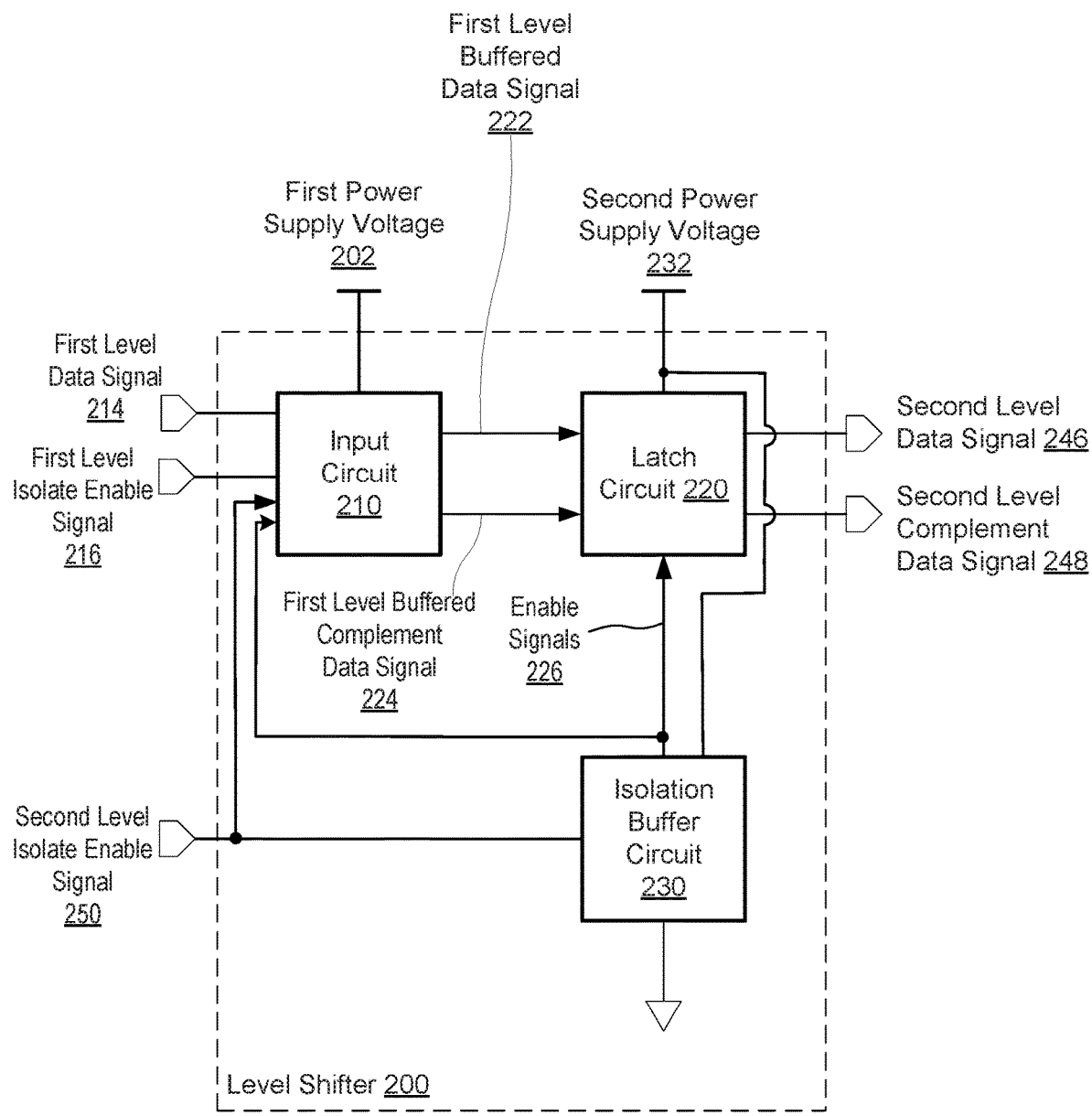
FIG. 2 shows a block diagram of an embodiment of a level shifter.

As described above, when transmitting signals across power domain boundaries, a level shifting circuit, such as level shifters 120-122, are employed to translate the voltage levels of the binary logic high and low levels. Turning now to FIG. 2, a generalized block diagram of one embodiment of a level shifter 200 is shown. In various embodiments, level shifter 200 corresponds to level shifter 120 as illustrated in FIG. 1. In various embodiments, the voltage levels for the first power supply voltage 202 and the second power supply voltage 232 are different. In the illustrated embodiment, level shifter 200 translates binary logic signals from a power domain associated with the first power supply voltage 202 to a power domain associated with the second power supply voltage 232. In the illustrated embodiment, level shifter 200 includes input circuit 210, latch circuit 220, and isolation buffer circuit 230.

As shown, each of the isolation buffer circuit 230 and the latch circuit 220 use the second power supply voltage 232, whereas, the input circuit 210 uses the first power supply voltage 202. In the illustrated embodiment, level shifter 200 receives the first level data signal 214 and the first level isolation enable signal 216, which are signals generated by external circuitry using the first power supply voltage 202. Although signal 214 is described as a data signal generated by circuitry using the first power supply voltage 202, in other embodiments, signal 214 is a control signal generated by circuitry using the first power supply voltage 202. In addition, level shifter 200 receives the second level isolate enable signal 250, which is a signal generated by external circuitry using the second power supply voltage 232. Level shifter 200 uses the received signals to generate the second level data signal 246 and the second level complement data signal 248.

In some embodiments, when the voltage level of the first power supply voltage 202 drops below a threshold voltage level, or when the first power supply voltage 202 is expected to drop below a threshold voltage level, a power management unit, or other suitable circuit, enables isolation by asserting the second level isolate enable signal 250. In some embodiments, the asserted value of the second level isolate enable signal 250 is a binary logic low level. The enabling of isolation, or alternatively, the assertion of the second level isolate enable signal 250, indicates to the level shifter 200 to clamp particular nodes in latch circuit 220. In addition, level shifter 200 isolates one or more circuit paths in latch circuit 220. As used herein, a signal is considered "asserted" when the signal has a particular voltage level used for enabling combinatorial logic or devices. In some cases, a logic high level is considered as an asserted signal such as when NFETs are being enabled. In other cases, a logic low level is considered as an asserted signal such as when PFETs are being enabled. A signal is considered "de-asserted" or "negated" when the signal has a particular voltage level used for disabling combinatorial logic or devices. In some cases, a logic low level is considered as a negated signal such as when NFETs are being disabled. In other cases, a logic high level is considered as a negated signal such as when PFETs are being disabled.

In some embodiments, an external level shifter receives the second level isolate enable signal 250 and generates the first level isolate enable signal 216. In various embodiments, the first level isolate enable signal 216 and the second level isolate enable signal 250 correspond to the first level isolate enable signal 116 and the second level isolate enable signal 150 of FIG. 1. Further, input circuit 210 receives one or more enable signals 226 generated by the isolation buffer circuit 230. In an embodiment, the first level buffered data signal 222 is a buffered version of the first level data signal 214, while the first level buffered complement data signal 224 is the logical inverse of the first level data signal 214.

It is noted that although the input circuit 210 uses the first power supply voltage 202 and generates the output signals 222 and 224, which are also based on the first power supply voltage 202, the input circuit 210 receives multiple signals based on the second power supply voltage 232. One of these received signals based on the second power supply voltage 232 is the second level isolate enable signal 250. In addition, the input circuit 210 receives the second level complement isolate enable signal of enable signals 226 from the isolation buffer circuit 230, which uses the second power supply voltage 232.

In some embodiments, the first level isolate enable signal 216 is generated by an external level shifter receiving the second level isolate enable signal 250. For example, referring briefly again to FIG. 1, the level shifter 122 receives the second level isolate enable signal 150 and generates the first level isolate enable signal 116. Therefore, in FIG. 2, the second level isolate enable signal 250 transitions before the first level isolate enable signal 216 transitions. The transition at a given point in time is one of a rising edge transition and a falling edge transition. Accordingly, in some embodiments, when isolation is enabled by an external power management unit or other circuitry, the second level isolate enable signal 250 transitions to a binary logic low value before the first level isolate enable signal 216 has a similar transition. In other embodiments, when isolation is enabled, the second level isolate enable signal 250 transitions to a binary logic high value before the first level isolate enable signal 216 has a similar transition. These two enable signals 216 and 250 and the delayed transition are used to remove glitches in the level shifter 200. The circuitry within the input circuit 210 is described later in FIG. 3.

Latch circuit 220 receives both the first level buffered data signal 222 and the first level buffered complement data signal 224. Latch circuit 220 uses the second power supply voltage 232, and generates the second level data signal 246 and the second level complement data signal 248. Each of the second level data signal 246 and the second level complement data signal 248 uses binary logic levels corresponding to the binary logic levels of the first level buffered data signal 222 and the first level buffered complement data signal 224, respectively. The binary logic high level of each of the output signals 246 and 248 is at or near the voltage level of the second power supply voltage 232.

Isolation buffer circuit 230 uses the second power supply voltage 232. Isolation buffer circuit 230 generates the enable signals 226 using the second level isolate enable signal 250. In various embodiments, the second level isolate enable signal 250 transitions in response to a change in the voltage level of the first power supply voltage 202. When the voltage level of the first power supply voltage 202 drops or is expected to drop below a threshold voltage level, a power management unit, or other suitable circuit, enables isolation by asserting the second level isolate enable signal 250. In some embodiments, the asserted value of the second level isolate enable signal 250 is a binary logic low level. The enabling of isolation, or alternatively, the assertion of the second level isolate enable signal 250, indicates to the level shifter 200 to clamp particular nodes in latch circuit 220. In addition, level shifter 200 isolates one or more circuit paths in latch circuit 220.

When the voltage level of the first power supply voltage 202 returns to a level above the threshold voltage level, the computing system is ready to transmit data through the level shifter 200. Additionally, when the voltage level of the first power supply voltage 202 returns to a level above the threshold voltage level, the second level isolate enable signal 250 is de-asserted (negated), thereby returning latch circuit 220 to its initial operating state. By clamping the particular nodes, and isolating the circuit paths, level shifter 200 avoids spurious logic changes on output signals 246 and 248, as well as reduces leakage and crowbar current in latch circuit 220.

As described below in more detail, to clamp the particular nodes as described above, latch circuit 220 enables a pull-up or pull-down device coupled to the aforementioned particular nodes. As used herein, a "pull-up" or "pull-down" device refers to a device, such as, for example, a resistor, transistor, or other suitable type of transconductance device coupled between a circuit node to be "pulled," and either a power node (pull-up) or ground node (pull-down). It is noted that, to improve clarity and to aid in demonstrating the disclosed concepts, the block diagram illustrated in FIG. 2 has been simplified. In other embodiments, different and/or additional circuit blocks and different configurations of the circuit blocks are possible and contemplated.

Figure 3:
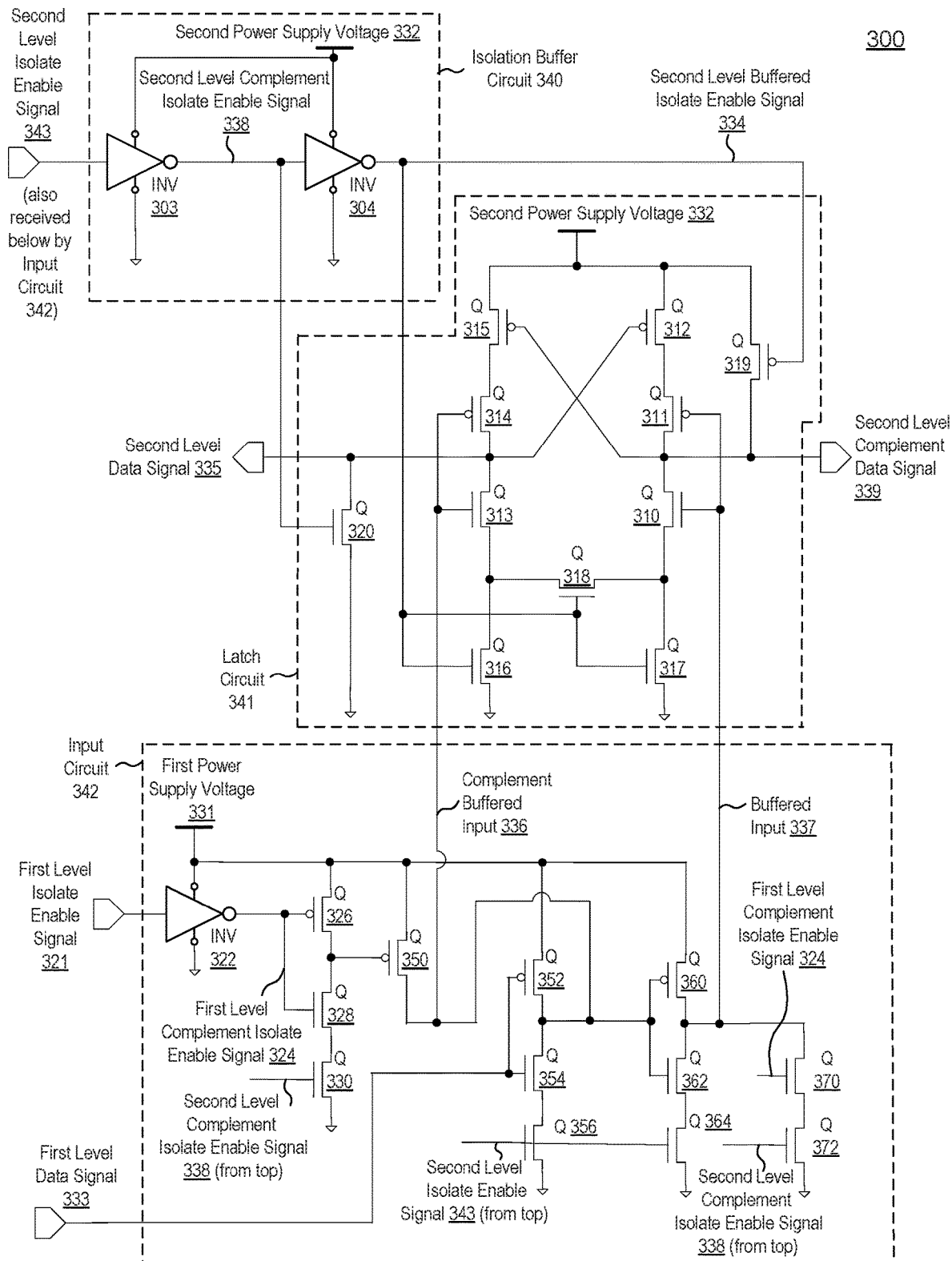
FIG. 3 shows a block diagram of another embodiment of a level shifter.

Referring to FIG. 3, a generalized block diagram of another embodiment of a level shifter 300 is shown. In various embodiments, level shifter 300 corresponds to level shifter 200 as illustrated in FIG. 2 and level shifter 120 as illustrated in FIG. 1. In various embodiments, the voltage levels for the first power supply voltage 331 and the second power supply voltage 332 are different. In the illustrated embodiment, level shifter 300 translates binary logic signals from a first power domain associated with the first power supply voltage 331 to a second power domain associated with the second power supply voltage 332. In the illustrated embodiment, level shifter 300 includes input circuit 342, latch circuit 341, and isolation buffer circuit 340.

As shown, each of the isolation buffer circuit 340 and the latch circuit 341 use the second power supply voltage 332, whereas, the input circuit 342 uses the first power supply voltage 331. In the illustrated embodiment, level shifter 300 receives the first level data signal 333 and the first level isolation enable signal 321, which are signals generated by external circuitry using the first power supply voltage 331. Although signal 333 is described as a data signal generated by circuitry using the first power supply voltage 331, in other embodiments, signal 333 is a control signal generated by circuitry using the first power supply voltage 331. In addition, level shifter 300 receives the second level isolate enable signal 343, which is a signal generated by external circuitry using the second power supply voltage 332. Level shifter 300 uses the received signals 321, 333 and 343 to generate two output signals such as the second level complement data signal 339 and the second level data signal 335.

In some embodiments, when the voltage level of the first power supply voltage 331 drops or is expected to drop below a threshold voltage level, a power management unit, or other suitable circuit, enables isolation by asserting the second level isolate enable signal 343. In some embodiments, the asserted value of the second level isolate enable signal 343 is a binary logic low level. The enabling of isolation, or alternatively, the assertion of the second level isolate enable signal 343, indicates to the level shifter 300 to clamp particular nodes such as the complement buffered input 336 and the buffered input 337 received by the latch circuit 341. In addition, level shifter 300 isolates one or more circuit paths in latch circuit 341. In various embodiments, the clamping of the nodes 336 and 337 causes the latch circuit 341 to also clamp its two output signals such as the second level complement data signal 339 and the second level data signal 335.

In some embodiments, the first level isolate enable signal 321 is generated by an external level shifter receiving the second level isolate enable signal 343. For example, referring briefly again to FIG. 1, the level shifter 122 receives the second level isolate enable signal 150 and generates the first level isolate enable signal 116. Therefore, in FIG. 3, the second level isolate enable signal 343 transitions before the first level isolate enable signal 321. In some embodiments, when isolation is enabled, in some embodiments, the second level isolate enable signal 343 transitions to a binary logic low level. In other embodiments, the second level isolate enable signal 343 transitions to a binary logic high level. This transition for the second level isolate enable signal 343 occurs before the first level isolate enable signal 321 has a similar transition. These two enable signals 321 and 343 and the delayed transition are used to remove glitches in the level shifter 300.

Isolation buffer circuit 340 includes two inverters labeled as INV 303 and INV 304. In various embodiments, isolation buffer circuit 340 correspond to isolation buffer circuit 230 as illustrated in FIG. 2. Power supply terminals of INV 303 and 304 are connected to the second power supply voltage 332. INV 303 inverts the logical level of the second level isolate enable signal 343 to generate the second level complement isolate enable signal 338. The inverter INV 304 inverts the logical level of signal 338 to generate the second level buffered isolate enable signal 334.

It is noted that an inverter, such as those shown and described herein, is a particular embodiment of a complementary metal oxide semiconductor (CMOS) inverting amplifier. In other embodiments, however, any suitable configuration of inverting amplifier that is capable of inverting the logical level of a signal is used, including inverting amplifiers built using technology other than CMOS. Each of the devices described below, such as, e.g. Q310, in various embodiments, corresponds to metal-oxide semiconductor field-effect transistors (MOSFETs) or any other suitable type of transconductance device. Although single devices are depicted in the diagram of FIG. 3, in other embodiments, multiple devices are used in parallel to form any of the below devices.

In some embodiments, latch circuit 341 corresponds to latch circuit 220 illustrated in FIG. 2. In the illustrated embodiment, latch circuit 341 includes devices Q310 through Q320. As shown, devices Q315 and Q312 (both being PFETs) are connected to the second power supply voltage 332, and are controlled on their gate inputs by the second level complement data signal 339 and the second level data signal 335, respectively. The drain terminal of device Q315 is further connected to the source terminal of device Q314 (a PFET), which has its drain terminal connected to the second level data signal 335. The device Q312 (a PFET) has its drain terminal connected to the source terminal of the device Q311 (a PFET), which is, in turn, has its drain terminal connected to the complement output 339. Device Q313 (an NFET) has its drain terminal connected to the second level data signal 335. Device Q310 (an NFET) has its drain terminal connected to the second level complement data signal 339.

The source terminals of both devices Q313 and Q310 (both NFETs) are connected to device 318 (an NFET). Devices Q314 (a PFET) and Q313 (an NFET) have their gate terminals controlled by complement buffered input 336, and devices Q311 (a PFET) and Q310 (an NFET) have their gate terminals controlled by buffered input 337. The gate terminal of device Q318 (an NFET) is connected to the gate terminals of devices Q316 and Q317 (both NFETs), both of which have their source terminals connected to the ground reference voltage. Each of devices Q318, Q316, and Q317 have their gate terminals controlled by the second level buffered isolate enable signal 334.

In some embodiments, input circuit 342 corresponds to input circuit 210 illustrated in FIG. 2. It is noted that although the input circuit 342 uses the first power supply voltage 331 and generates the output signals 336 and 337, which are also based on the first power supply voltage 331, the input circuit 342 receives multiple signals based on the second power supply voltage 332. One of these received signals based on the second power supply voltage 332 is the second level isolate enable signal 343. In addition, the input circuit 342 receives the second level complement isolate enable signal 338 from the isolation buffer circuit 340, which uses the second power supply voltage 332.

In the illustrated embodiment, input circuit 342 includes inverter (INV) 322, which is connected to the first power supply voltage 331. Similarly, each of Q326, Q350, Q352 and Q326 (all PFETs) receive the first power supply voltage 331 on their source terminals. During operation, INV 322 inverts the binary logical level of the first level isolate enable signal 321 to generate the first level complement isolate enable signal 324. Each of Q326 (a PFET) and Q328 (an NFET) receives the first level complement isolate enable signal 324 on their gate terminals. The drain terminal of Q326 is connected to the drain terminal of Q328. The drain terminals of Q326 and 328 are also connected to the gate terminal of Q350, which is used as a precharge device. The device Q350 precharges the complement buffered input 336, which is sent to the latch circuit 341.

Rather than connect the source terminal of Q328 to a ground reference voltage, a footer device, which is Q330 (an NFET), has its drain terminal connected to the source terminal of Q328. The source terminal of Q330 is connected to the ground reference voltage. The gate terminal of Q330 receives the second level complement isolate enable signal 338. The device Q330 is enabled due to receiving the second level complement isolate enable signal 338, which is set at a logic high level when isolation is enabled, on its gate terminal. Therefore, when isolation is enabled, each of the devices Q328 and Q330 (both NFETS) are enabled, which sets the gate terminal of the pre-charge device Q350 to a logic low level. The enabled pre-charge device Q350 sets the complement buffered input 336 at a logic high level.

As described earlier, in some embodiments, the first level isolate enable signal 321 is generated by an external level shifter receiving the second level isolate enable signal 343. For example, referring briefly again to FIG. 1, the level shifter 122 receives the second level isolate enable signal 150 and generates the first level isolate enable signal 116. Therefore, in FIG. 3, in some embodiments, when isolation is enabled by an external power management unit or other circuitry, the first level isolate enable signal 321 is set at a binary logic low value after a delay through an external level shifter, which received the second level isolate enable signal 343. The inverter INV 322 (in input circuit 342) generates the inverse of this level by setting the first level complement isolate enable signal 324 at a binary logic high value. The device Q328 is enabled due to receiving the first level complement isolate enable signal 324 on its gate terminal. With each of the devices Q328 and Q330 (both NFETs) enabled, the gate terminal of the pre-charge device Q350 is pulled down to a binary logic low level, and device Q350 becomes enabled. With the precharge device Q350 enabled, the complement buffered input 336 is pulled up to a binary logic high value.

As shown, the complement buffered input 336, which is sent to the latch circuit 341, is not dependent on the first level data signal 333 when isolation is enabled (e.g., the first level isolate enable signal is set at a binary logic low level). In addition to disconnecting the complement buffered input 336 from the first level data signal 333 when isolation is enabled, the complement buffered input 336 is set by devices using the first power supply voltage 331. The first power supply voltage is also used by the first level data signal 333. Therefore, the portion of level shifter 300 (e.g., input circuit 342) spanning a first power domain associated with the first power supply voltage 331 is able to disconnect the complement buffered input 336 sent to latch circuit 341 from the indeterministic input (e.g., the first level data signal 333) by using an enable signal (e.g., the first level isolate enable signal 321) based on the first power supply voltage 331. In addition, the complement buffered input 336 sent to latch circuit 341 is disconnected from the indeterministic input (e.g., the first level data signal 333) by using an enable signal (e.g., the second level isolate enable signal 343) based on the second power supply voltage 332.

As shown, each of the devices Q352 (a PFET) and Q354 (an NFET) receives the first level data signal 333 on its gate terminal. The drain terminals of Q352 and Q354 are connected to one another and to the complement buffered input 336. Rather than connect the source terminal of Q354 to a ground reference voltage, a footer device, which is Q356 (an NFET), has its drain terminal connected to the source terminal of Q354. The source terminal of Q356 is connected to the ground reference voltage. The gate terminal of Q356 receives the second level isolate enable signal 343. Therefore, when isolation is enabled, the second level isolate enable signal 343 is set at a binary logic low level and there is no path to the ground reference voltage from the complement buffered input 336, since the device Q356 is disabled.

In the illustrated embodiment, each of the devices Q360 (a PFET) and Q362 (an NFET) receives the complement buffered input 336 on its gate terminal. The drain terminals of Q360 and Q362 are connected to one another and to the buffered input 337. The buffered input 337 is sent to latch circuit 341. As described earlier, one of the complement buffered input 336 and the buffered input 337 is received on the gate terminals of devices Q310-Q315 in the latch circuit 341. Rather than connect the source terminal of Q362 to a ground reference voltage, a footer device, which is Q364 (an NFET), has its drain terminal connected to the source terminal of Q362. The source terminal of Q364 is connected to the ground reference voltage. The gate terminal of Q364 receives the second level isolate enable signal 343. Therefore, when isolation is enabled, the second level isolate enable signal 343 is set at a binary logic low level and there is no path to the ground reference voltage from the buffered input 337, since the device Q364 is disabled.

As shown, the device Q370 (an NFET) has its drain terminal connected to the buffered input 337 and has its source terminal connected to the drain terminal of the device Q372 (an NFET). The source terminal of Q372 is connected to the ground reference voltage. The device Q370 receives the first level complement isolate enable signal 324 on its gate terminal, whereas, the device Q372 receives the second level complement isolate enable signal 338 on its gate terminal.

When isolation is enabled, the signals 324 and 338 received by devices Q370 and Q372 are set at a binary logic high level. Therefore, both devices Q370 and Q372 are enabled and pull down the buffered input 337 to a binary logic low value. Accordingly, when isolation is enabled, despite the first level data signal 333 possibly being set at an indeterministic voltage level, the buffered input 337 is still set at a deterministic level such as the binary logic low level. Similarly, as described earlier, despite the first level data signal 333 possibly being set at an indeterministic voltage level, the complement buffered input 336 is still set at a deterministic level such as the binary logic high level. Although the latch circuit 341 uses the second power supply voltage 332, the latch circuit 341 receives two inputs capable of using a binary logic high level based on the first power supply voltage 331. These two inputs are the complement buffered input 336 and the buffered input 337. The complement buffered input 336 and the buffered input 337 are set at a logic high level at different times, since they are complement values of one another, but when a logic high level is used, the logic high level is based on the first power supply voltage 331 and not the second power supply voltage 332.

As described above, the later transitioning and received enable signal, which is the first level isolate enable signal 321, is used to set the voltage levels of the complement buffered input 336 and the buffered input 337 within the input circuit 342. The first level isolate enable signal 321 sets the voltage levels of nodes 336-337 so that when isolation is disabled, the devices in the latch circuit 341 receiving the voltage levels of nodes 336-337 are already set at the desired voltage levels. For example, in the illustrated embodiment, node 336 is set at the binary logic high level and node 337 is set at the binary logic low level. These voltage levels ensure that the output signals 335 and 339 of the latch circuit 341 are maintained at desired voltage levels when isolation is disabled. For example, the binary logic high level of node 336 ensures that the second level data signal 335 is maintained at the binary logic low level when isolation is disabled, and the binary logic low level of node 337 ensures that the complement output 339 is maintained at the binary logic high level when isolation is disabled.

As described above, no glitches or any spurious changes of voltage levels occur on the output nodes 335 and 339 as a result of the first level isolate enable signal 321 sets the voltage levels of nodes 336-337 within the input circuit 342. In addition to setting the nodes 336-337 based on the first level isolate enable signal 321, the delayed version of the received second level isolate enable signal 343, which is signal 338, is received by the latch circuit 341 so the latch circuit is enabled after the nodes 336-337 are set to desired voltage levels when isolation is disabled.

As described above, the earlier transitioning and received enable signal, which is the second level isolate enable signal 343, is received by each of the footer NFETs Q356 and Q364 in the input circuit 342. Again, during isolation, the second level isolate enable signal 343 is asserted by being set at a binary logic low level. Therefore, the first level data signal 333 does not affect the nodes 336-337 when isolation is enabled, since the series NFET stacks of Q354-356 and Q362-364 do not have an enabled path to the ground reference voltage. Additionally, when isolation is disabled, the delayed version of the second level isolate enable signal 343, which is signal 338, disables the path to the ground reference voltage for the NFET stack with the devices Q328-330. Therefore, the gate terminal of the precharge device Q350 is no longer controlled until the binary logic high level is reached on the gate terminal of the precharge device Q350 due to the first level isolate enable signal 321 transitions to the binary logic high level when isolation is disabled.

Figure 4:
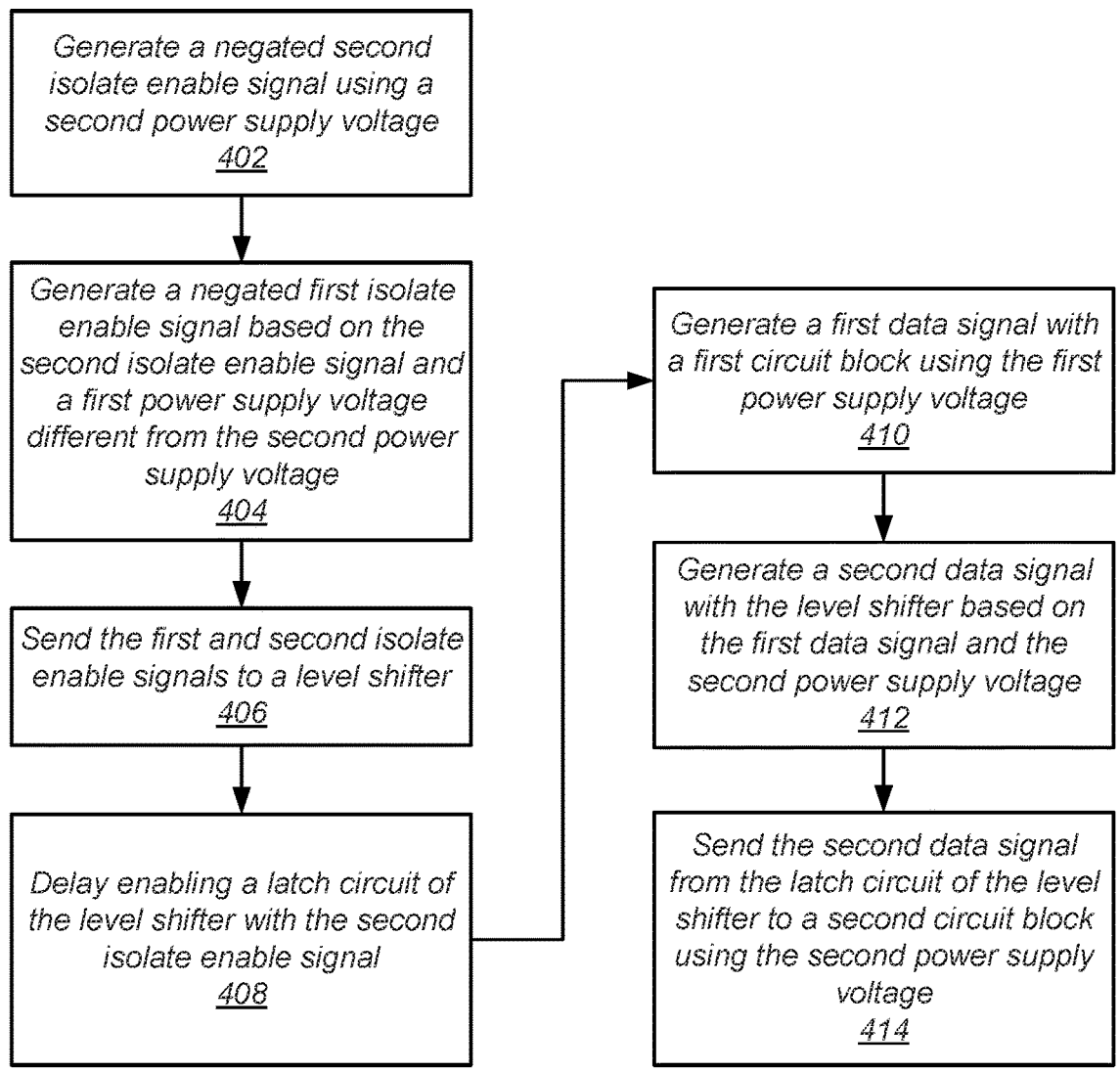
FIG. 4 illustrates a flow diagram of an embodiment of a method for efficiently handling voltage level shifting.

Referring now to FIG. 4, a generalized flow diagram of one embodiment of a method 400 for efficiently handling voltage level shifting is shown. For purposes of discussion, the steps in this embodiment (as well as for FIG. 5) are shown in sequential order. However, in other embodiments some steps may occur in a different order than shown, some steps may be performed concurrently, some steps may be combined with other steps, and some steps may be absent.

A negated second isolate enable signal using a second power supply voltage is generated (block 402). In various embodiments, the second isolate enable signal is used to indicate when a first level shifter is to be isolated. One or more conditions, such as detecting a power gating process, are used to determine when isolation of the first level shifter is enabled. In some embodiments, the second isolate enable signal has a binary logic high level when it is negated. Although, in other embodiments, the opposite polarity is used to indicate it is negated.

A negated first isolate enable signal is generated based on the second isolate enable signal and a first power supply voltage different from the second power supply voltage (block 404). In some embodiments, a second level shifter generates the first isolate enable signal from the second isolate enable signal. Therefore, the first isolate enable signal is a delayed version of the second isolate enable signal. The first and second isolate enable signals are sent to a level shifter such as the first level shifter (block 406). In various embodiments, the first level shifter is connected to both the first power supply voltage and the second power supply voltage.

The level shifter delays enabling a latch circuit included in the level shifter with the second isolate enable signal (block 408). In some embodiments, a delayed version of the second isolate enable signal is sent to the latch circuit, whereas, a non-delayed version is sent to other circuitry included in the level shifter such as an input circuit. In an embodiment, the delayed version is also an inverted version of the second isolate enable signal. In some embodiments, the delay allows particular particular nodes in the level shifter to settle at stable voltage levels before being used to set the voltage levels on outputs of the latch circuit. The delay reduces or even removes glitches from the outputs of the latch circuit.

A first data signal is generated by a first circuit block using the first power supply voltage (block 410). A second data signal is generated by the level shifter based on the first data signal and the second power supply voltage (block 412). The second data signal is sent from the latch circuit of the level shifter to a second circuit block using the second power supply voltage (block 414). Therefore, the level shifter shifted the voltage level of the received first data signal, and did so, with no glitches on the outputs of the level shifter. The level shifter used two enable signals from two power supply voltages to perform the shifting and to reduce the glitches on the outputs.

Figure 5:
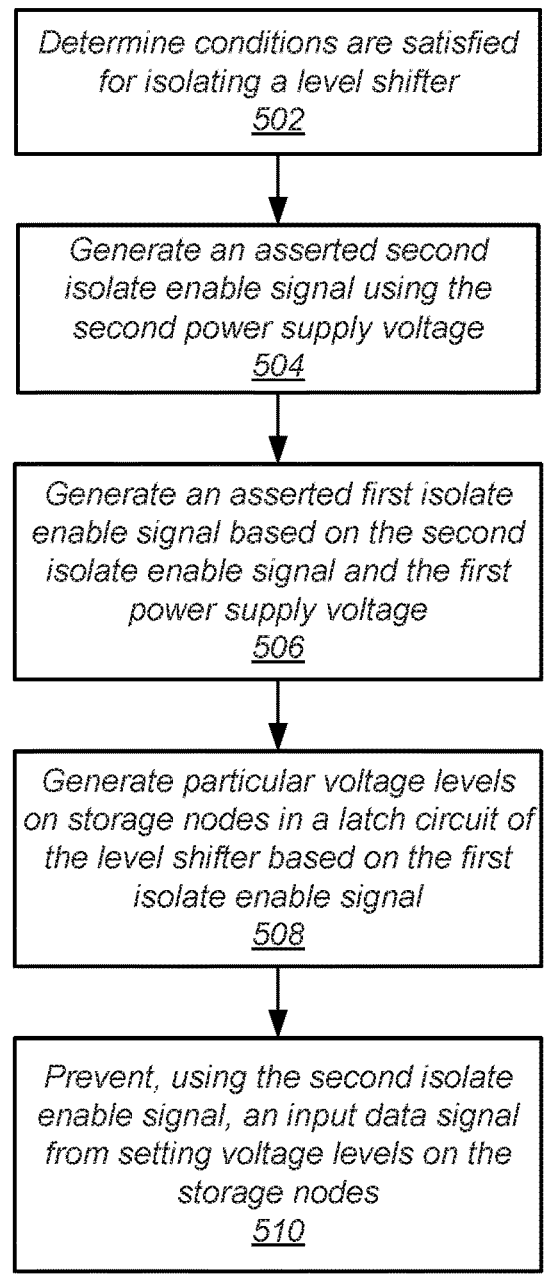
FIG. 5 illustrates a flow diagram of an embodiment of a method for efficiently handling voltage level shifting.

Turning now to FIG. 5, a generalized flow diagram of one embodiment of a method 500 for efficiently handling voltage level shifting is shown. It is determined that conditions are satisfied for isolating a level shifter (block 502). As described earlier, one or more conditions, such as detecting a power gating process, are used to determine when isolation of the level shifter is enabled. An asserted second isolate enable signal using a second power supply voltage is generated (block 504). An asserted first isolate enable signal is generated based on the second isolate enable signal and the first power supply voltage (block 506). In some embodiments, another level shifter generates the first isolate enable signal from the second isolate enable signal. Therefore, the first isolate enable signal is a delayed version of the second isolate enable signal.

Particular voltage levels are generated on particular nodes in a latch circuit of the level shifter based on the first isolate enable signal (block 508). The particular voltage levels are selected based on which voltage levels would reduce or remove glitches on the output nodes of the latch circuit included in the level shifter. For example, referring briefly again to FIG. 3, a binary logic high level is used on node 336 and a binary logic low level is used on node 337. Using the second isolate enable signal, an input data signal received by the level shifter is prevented from setting voltage levels on the particular nodes (block 510).

Preventing the input data signal from setting voltage levels of the particular node includes disabling, using the second isolate enable signal, at least one device between the particular node and a reference voltage level. Referring briefly again to FIG. 3, when isolation is enabled, the second level isolate enable signal 343 is set at a binary logic low level and there is no path to the ground reference voltage from the complement buffered input 336, since the device Q356 is disabled. Similarly, when isolation is enabled, the second level isolate enable signal 343 is set at a binary logic low level and there is no path to the ground reference voltage from the buffered input 337, since the device Q364 is disabled. Therefore, there are no glitches, or spurious voltage levels, on the particular nodes 336-337 or the outputs 335 and 339 of the level shifter 300.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A computing system comprising:
a first circuit block configured to generate a first data signal using a first power supply voltage; and
a first level shifter coupled to both the first power supply voltage and a second power supply voltage different from the first power supply voltage, wherein the first level shifter is configured to:
receive a first isolate enable signal based on the first power supply voltage;
receive a second isolate enable signal based on the second power supply voltage;
generate a particular voltage level on a particular node in the first level shifter, in response to determining the first isolate enable signal is asserted; and
prevent the first data signal from setting a voltage level on the particular node, in response to determining the second isolate enable signal is asserted; and
generate a second data signal based at least upon the second power supply voltage and a voltage level on the particular node.

2. The computing system as recited in claim 1, wherein to prevent the first data signal from setting the voltage level of the particular node, the first level shifter is further configured to disable, by using the second isolate enable signal, at least one device between the particular node and a reference voltage level.

3. The computing system as recited in claim 2, wherein the reference voltage level is a ground reference voltage level.

4. The computing system as recited in claim 1, wherein in response to a determination that isolation for the first level shifter is disabled, the first level shifter is further configured to delay, using the second isolate enable signal, enabling a latch circuit included in the first level shifter.

5. The computing system as recited in claim 4, wherein in response to the determination that isolation for the first level shifter is disabled, the first level shifter is further configured to enable the first data signal to set the voltage level of the particular node.

6. The computing system as recited in claim 5, wherein to enable the first data signal to set the voltage level of the particular node, the first level shifter is further configured to enable, using the second isolate enable signal, at least one device between the particular node and a reference voltage level.

7. The computing system as recited in claim 5, wherein in response to a determination that isolation for the first level shifter is disabled, the first level shifter is further configured to generate the second data signal based on both the second power supply voltage and the first data signal via the particular node.

8. The computing system as recited in claim 7, wherein the computing system further comprises a second circuit block coupled to the second power supply voltage, wherein the second circuit block is configured to receive the second data signal.

9. The computing system as recited in claim 1, wherein the computing system further comprises a second level shifter configured to generate the first isolate enable signal based on both the second isolate enable signal and the first power supply voltage.

10. A method comprising:
generating, by a first circuit block coupled to a first power supply voltage, a first data signal using the first power supply voltage;
receiving a first isolate enable signal based on the first power supply voltage by circuitry of a first level shifter coupled to the first power supply voltage and a second power supply voltage different from the first power supply voltage;
receiving, by the circuitry of the first level shifter, a second isolate enable signal based on the second power supply voltage;

generating, by the first level shifter, a particular voltage level on a particular node in the first level shifter based at least in part on a determination that the first isolate enable signal is asserted;

preventing, by the first level shifter, the first data signal from setting a voltage level on the particular node based at least in part on a determination that the second isolate signal is asserted; and generating, by the first level shifter, a second data signal based at least upon the second power supply voltage and a voltage level on the particular node.

11. The method as recited in claim 10, wherein preventing the first data signal from setting the voltage level of the particular node comprises disabling, by using the second isolate enable signal, at least one device between the particular node and a reference voltage level.

12. The method as recited in claim 10, wherein in response to a determination that isolation for the first level shifter is disabled, the method further comprises delaying, by using the second isolate enable signal, enabling a latch circuit included in the first level shifter.

13. The method as recited in claim 12, wherein in response to the determination that isolation for the first level shifter is disabled, the method further comprises enabling the first data signal to set the voltage level of the particular node.

14. The method as recited in claim 13, wherein enabling the first data signal to set the voltage level of the particular node comprises enabling, by using the second isolate enable signal, at least one device between the particular node and a reference voltage level.

15. The method as recited in claim 13, wherein in response to a determination that isolation for the first level shifter is disabled, the method further comprises generating the second data signal based on both the second power supply voltage and the first data signal via the particular node.

16. The method as recited in claim 10, further comprising generating, by a second level shifter, the first isolate enable signal based on both the second isolate enable signal and the first power supply voltage.

17. An apparatus comprising:

an input circuit coupled to a first power supply voltage, wherein the input circuit is configured to:
  receive a first isolate enable signal based on the first power supply voltage; and
  receive a second isolate enable signal based on a second power supply voltage different from the first power supply voltage; and a latch circuit coupled to the second power supply voltage, wherein the latch circuit is configured to convey an output data signal based on a voltage level of a particular node included in the latch circuit; and the input circuit is configured to:
  generate a particular voltage level on the particular node based at least in part on a determination that the first isolate enable signal is asserted; and
  prevent the first data signal from setting a voltage level on the particular node based at least in part on a determination that the second isolate signal is asserted.

18. The apparatus as recited in claim 17, wherein to prevent the first data signal from setting the voltage level of the particular node, the input circuit is further configured to disable, by using the second isolate enable signal, at least one device between the particular node and a reference voltage level.

19. The apparatus as recited in claim 17, wherein the apparatus further comprises an isolation buffer circuit, wherein in response to a determination that isolation for the first level shifter is disabled, the isolation buffer circuit is configured to delay, by using the second isolate enable signal, enabling the latch circuit.

20. The apparatus as recited in claim 19, wherein in response to the determination that isolation for the first level shifter is disabled, the input circuit is further configured to enable the first data signal to set the voltage level of the particular node.

* * * * *